United States Patent
Pei

(10) Patent No.: US 8,021,032 B2
(45) Date of Patent: Sep. 20, 2011

(54) LIGHT EMITTING DIODE BACK LIGHT MODULE

(75) Inventor: Chien-Chang Pei, Tu Chen (TW)

(73) Assignee: Everlight Electronics Co., Ltd., New Taipei (TW)

( * ) Notice: Subject to any disclaimer, the term of this patent is extended or adjusted under 35 U.S.C. 154(b) by 542 days.

(21) Appl. No.: 11/890,722

(22) Filed: Aug. 7, 2007

(65) Prior Publication Data

US 2008/0291360 A1 Nov. 27, 2008

(30) Foreign Application Priority Data

May 23, 2007 (TW) .............................. 96208407 U

(51) Int. Cl.
*F21V 7/04* (2006.01)
*G02F 1/1333* (2006.01)
*G02F 1/1335* (2006.01)

(52) U.S. Cl. ............. 362/612; 362/632; 349/58; 349/61

(58) Field of Classification Search .................. 362/612, 362/634; 349/61, 58
See application file for complete search history.

(56) References Cited

U.S. PATENT DOCUMENTS

| 7,611,274 | B2 * | 11/2009 | Hsiao et al. | 362/634 |
| 7,708,451 | B2 * | 5/2010 | Jang et al. | 362/633 |
| 2007/0002590 | A1 * | 1/2007 | Jang et al. | 362/633 |
| 2008/0232134 | A1 * | 9/2008 | Weng et al. | 362/612 |

* cited by examiner

*Primary Examiner* — Nathanael R Briggs
(74) *Attorney, Agent, or Firm* — Han IP Law PLLC; Andy M. Han

(57) ABSTRACT

An LED back light module includes a metal support, a thermal conductive material, a circuit board and at least one light emitting diode. The metal support has a recess and a plurality of holes. The thermal conductive material has a first surface in contact with a bottom of the recess. The circuit board is disposed on a second surface of the thermal conductive material, in which the circuit board has a plurality of flanges lodged into the holes of the metal support for compacting the circuit board, the thermal conductive material and the metal support. The light emitting diode is disposed on the circuit board, in which the thermal energy generated by the light emitting diode is delivered to the metal support through the circuit board and the thermal conductive material.

20 Claims, 7 Drawing Sheets

LIGHT EMITTING DIODE BACK LIGHT MODULE

RELATED APPLICATIONS

This application claims priority to Taiwan Application Serial Number 96208407, filed May 23, 2007, which is herein incorporated by reference.

BACKGROUND

1. Field of Invention

The present invention relates to a light emitting diode device. More particularly, the present invention relates to a light emitting diode back light module.

2. Description of Related Art

The back light module is the key component of the liquid crystal display. The liquid crystal can't generate light by itself. Therefore, the back light module is needed to provide sufficient and symmetrical light, which enables the liquid crystal display panel to show images correctly. The liquid crystal display is used frequently in electronics products, such as monitors, notebooks, digital camera, and projectors. The need for back light modules is increasing accordingly.

The back light module includes light emitting diodes. In the conventional back light modules, the thermal energy generated by the light emitting diodes is dissipated through the thermal conductive material. However, if the thermal conductive material cannot deliver the thermal energy to the environment efficiently, the remaining thermal energy might damage the light emitting diodes.

For the foregoing reasons, there is a need for a new light emitting diode back light module which can dissipates the thermal energy generated by the light emitting diode efficiently to prevent the light emitting diodes from being damaged.

SUMMARY

According to one embodiment of the present invention, a light emitting diode back light module includes a metal support, a thermal conductive material, a circuit board and at least one light emitting diode. The metal support has a recess and a plurality of holes. The thermal conductive material has a first surface in contact to a bottom of the recess. The circuit board is disposed on a second surface of the thermal conductive material, in which the circuit board has a plurality of flanges lodged into the holes of the metal support for compacting the circuit board, the thermal conductive material and the metal support. The light emitting diode is disposed on the circuit board, in which the thermal energy generated by the light emitting diode is delivered to the metal support through the circuit board and the thermal conductive material.

According to another embodiment of the present invention, a light emitting diode back light module includes a metal support, a thermal conductive material, a circuit board, at least one light emitting diode, and at least one elastic element. The metal support has a recess. The thermal conductive material has a bottom-side surface in contact with a bottom of the recess. The circuit board has a first surface in contact with a board-side surface of the thermal conductive material. The light emitting diode is disposed on a second surface of the circuit board. The elastic element has ends lodged in two holes of the metal support, in which a main part of the elastic element presses the circuit board for compacting the circuit board, the thermal conductive material and the metal support.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
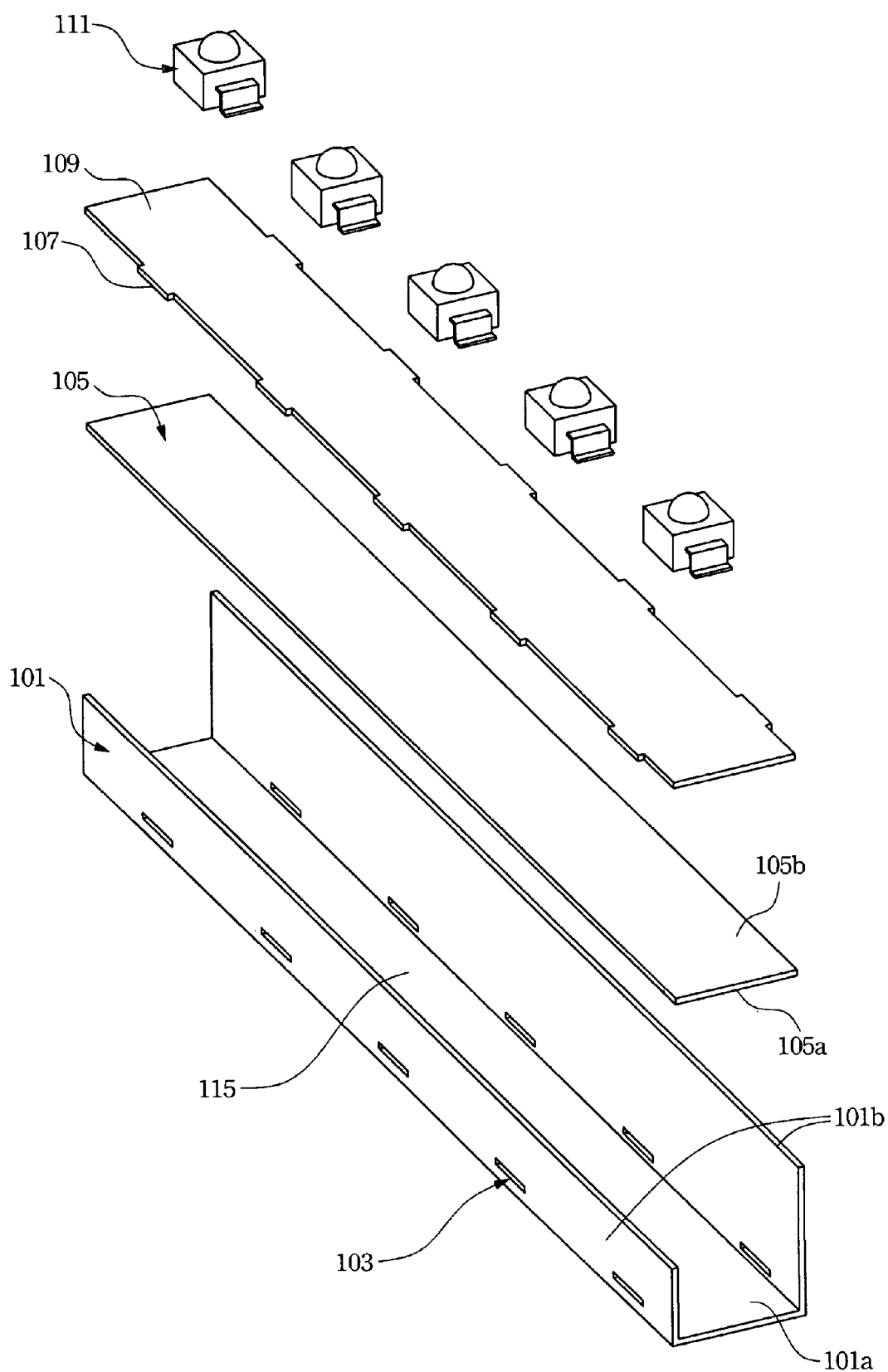
FIG. 1 shows the light emitting diode device according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The following light emitting diode back light module according to the embodiments of the present invention lodges the flanges of the circuit board or the elastic elements into the holes of the metal support, which compacts the circuit board, the thermal conductive material and the metal support, such that the thermal energy generated by the light emitting diodes can be dissipated more efficiently.

FIG. 1 shows the light emitting diode device according to one embodiment of the present invention. The light emitting diode device includes light emitting diodes 111, circuit board 109 and metal support 101. The light emitting diodes 111 are disposed on the circuit board 109. The circuit board 109 can be a printed circuit board, a metal substrate or a ceramic substrate. The metal support 101, being an L shape or a U shape, has a recess 115. The recess 115 has a bottom 101a and two sidewalls 101b. The sidewalls 101b touch the bottom 101a, in which the heights of the two sidewalls 101b can be the same or different. The holes 103 are disposed on the sidewalls 101b.

The light emitting diode device further includes a thermal conductive material 105 disposed between the circuit board 109 and metal support 101. The thermal conductive material 105 has a bottom-side surface 105a in contact with the bottom 101a of the recess 115, and a board-side surface 105b in contact with the circuit board 109. The thermal conductive material 105 can be a liquid such as a liquid thermal conductive adhesive. The thermal conductive material 105 can also be a solid or a soft tape. In addition, the material of thermal conductive material 105 can be metal, nonmetal or a combination of metal and nonmetal.

Figure 2:
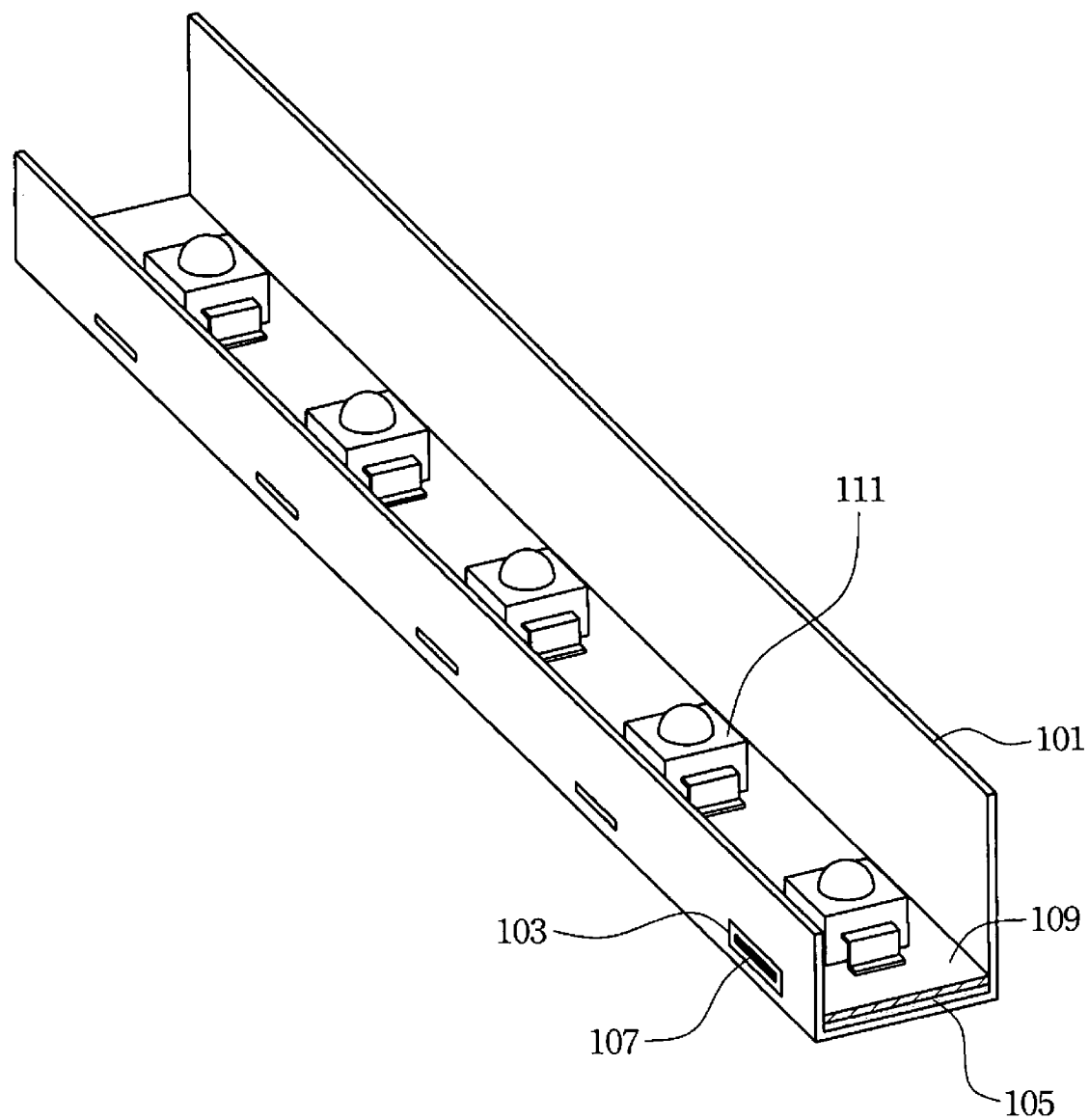
FIG. 2 shows the assembled light emitting diode device according to one embodiment of the present invention.

FIG. 2 shows the assembled light emitting diode device according to one embodiment of the present invention. By lodging the flanges 107 of the circuit board 109 into the holes 103 of the metal support 101, the circuit board 109, the thermal conductive material 105, and the metal support 101 can be compacted tightly.

Figure 3:
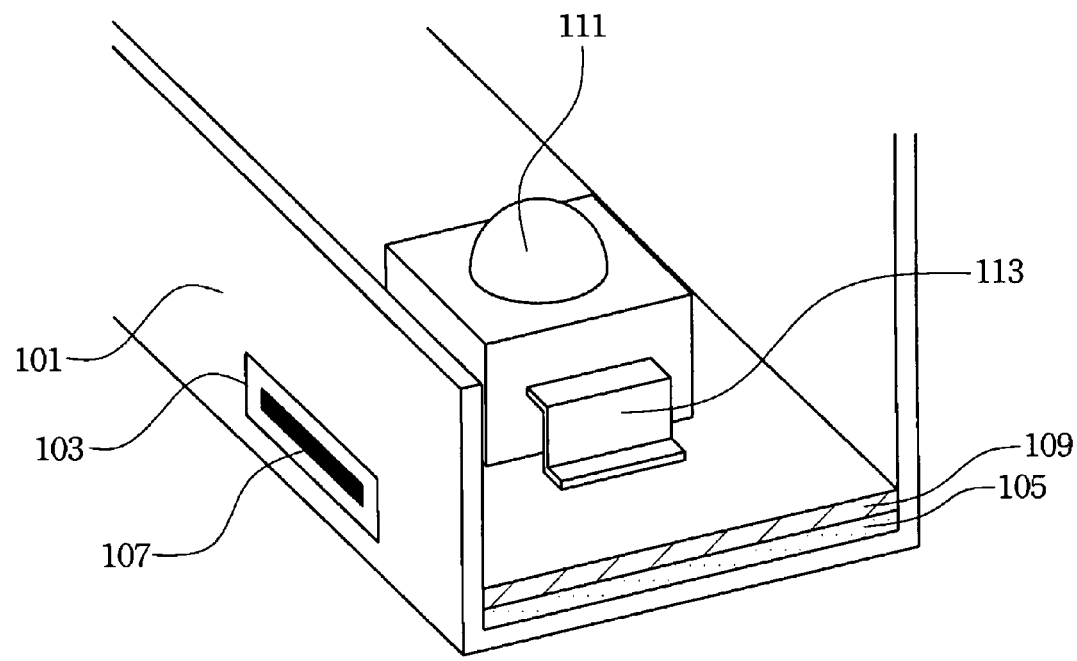
FIG. 3 shows the three dimensional diagram of the light emitting diode device according to one embodiment of the present invention.
Figure 4:
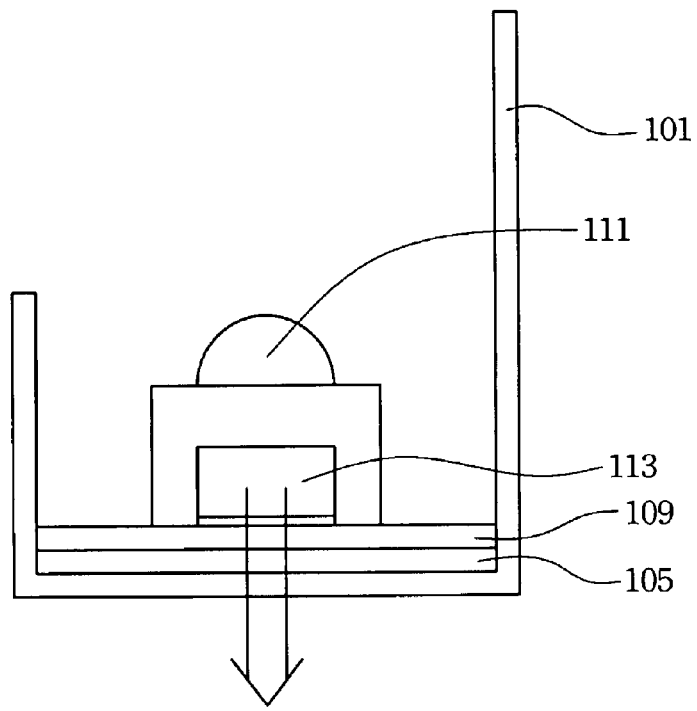
FIG. 4 shows the cross-section diagram of the light emitting diode device according to one embodiment of the present invention.

Please refer to both the FIG. 3 and the FIG. 4. FIG. 3 and FIG. 4 show the three dimensional diagram and the cross-section diagram of the light emitting diode device respectively according to one embodiment of the present invention. The thermal energy generated by the light emitting diode 111 is delivered to the metal support 101 through the holder 113, the circuit board 109, and the thermal conductive material 105, and then dissipated into the air. By lodging the flanges 107 of the circuit board 109 into the holes 103 of the metal support 101, the circuit board 109, the thermal conductive material 105, and the metal support 101 can be compacted tightly, such that the thermal energy can be dissipated more efficiently.

Figure 5:
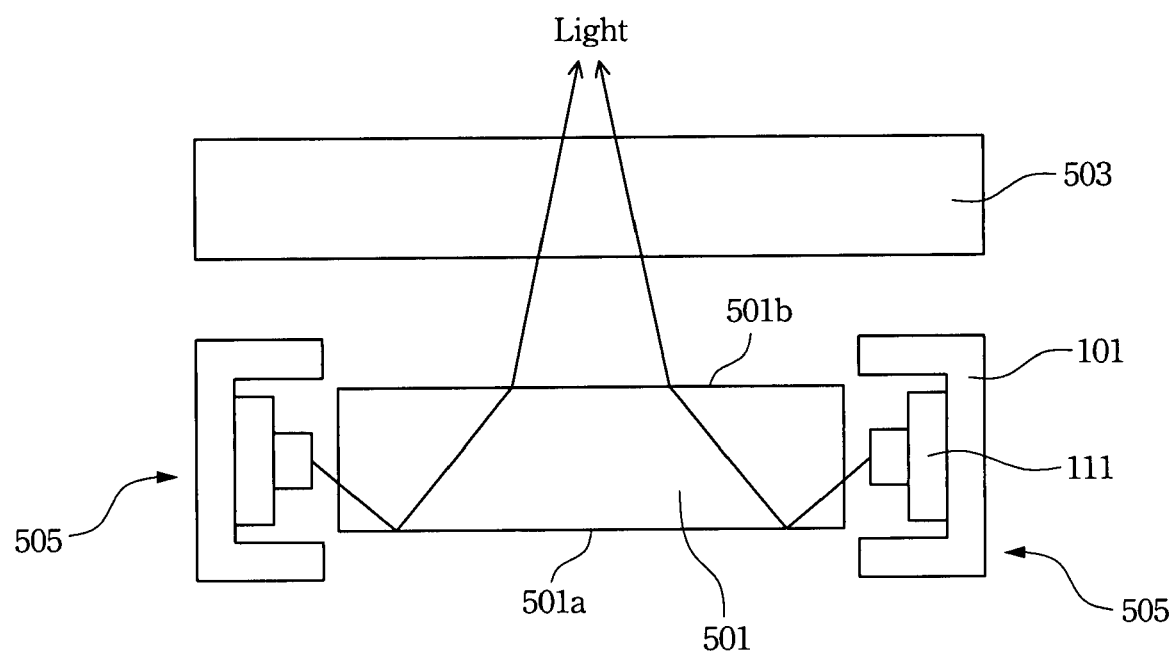
FIG. 5 shows the light emitting diode back light module according to one embodiment of the present invention.

FIG. 5 shows the light emitting diode back light module according to one embodiment of the present invention. The light emitting diode back light module includes a light guide device 501, a liquid crystal display panel 503, and light emitting diode device 505. Because the liquid crystal of the panel 503 can't produce light by itself, a light source is needed to provide sufficient and symmetrical light which enables the liquid crystal display panel 503 to show images correctly. Therefore, the light generated by the light emitting diode 111 is directed to the panel 503 by the light guide device 501.

The light guide device 503 has a surface 501a and a surface 50b. The surface 501a is a glossy surface. Because the refractive index of the 501a is greater than the refractive index of air, such that most of the light is reflected by the surface 501a, rather than delivered to the air by passing through the surface 501a. On the other hand, the surface 501b is particularly processed, such as forming grooves or dots in the surface 501b, such that the light can be refracted to the air.

Figure 6:
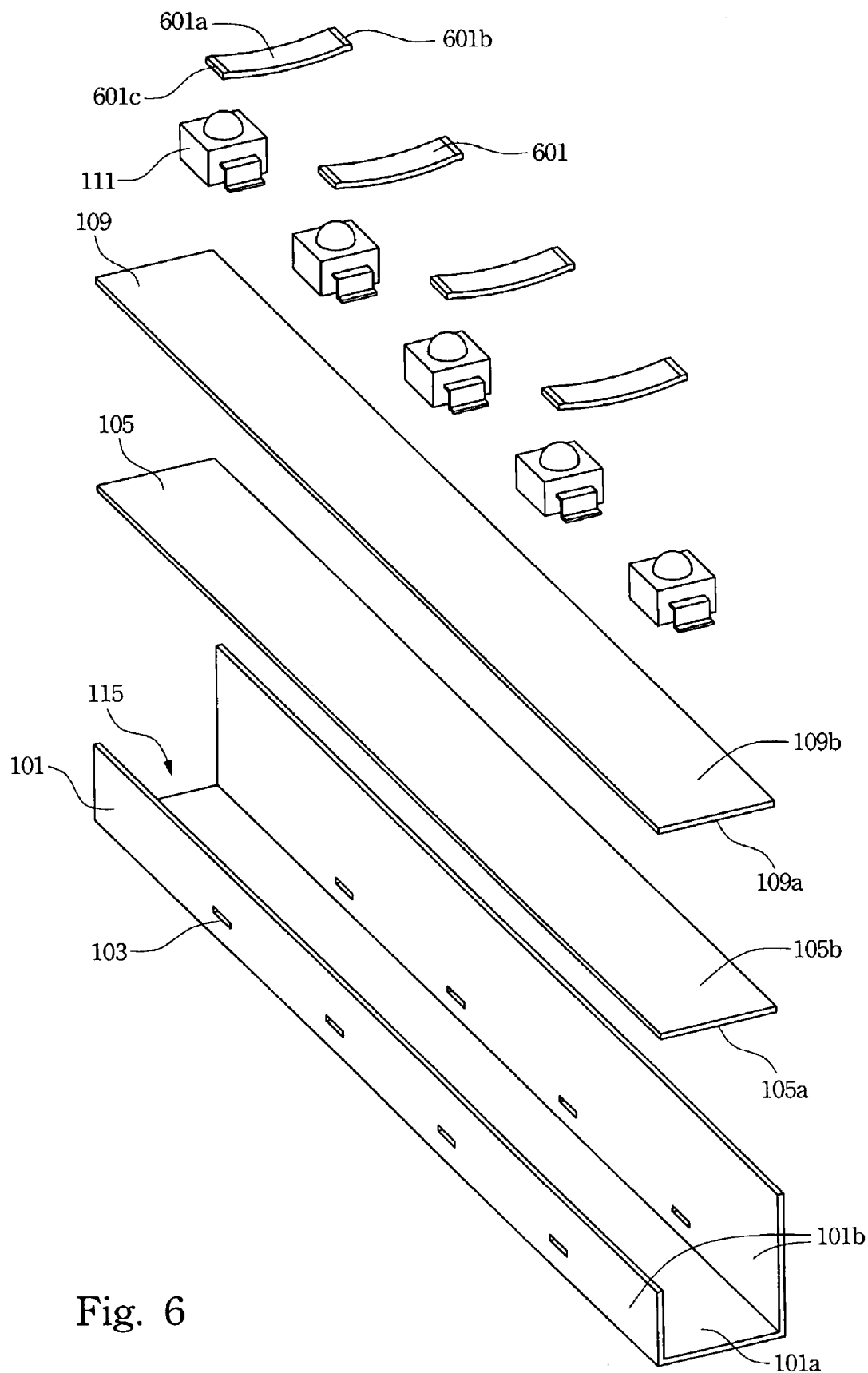
FIG. 6 shows the light emitting diode device according to another embodiment of the present invention.

FIG. 6 shows the light emitting diode device according to another embodiment of the present invention. The support 101 has a recess 115. The bottom-side surface 105a and the board-side surface 105b of the thermal conductive material 105 contact the bottom 101a of the recess 115 and the surface 109a of the circuit board 109. The light emitting diodes 111 are disposed on the other surface 109b of the circuit board 109. Compare with the FIG. 1, the elastic elements 601 are added to the light emitting diode device shown in FIG. 6. In addition, the circuit board 109 doesn't have any flanges on its sides.

The elastic element 601, made of plastic or metal, has a main part 601a and two ends 601b and 601c. The ends 601a and 601b of the elastic element 601 are lodged into the holes 103 of the metal support 101. The main part 601a of the elastic element 601 presses the circuit board 109 to compact the circuit board 109, the thermal conductive material 105 and the metal support 101.

Figure 7:
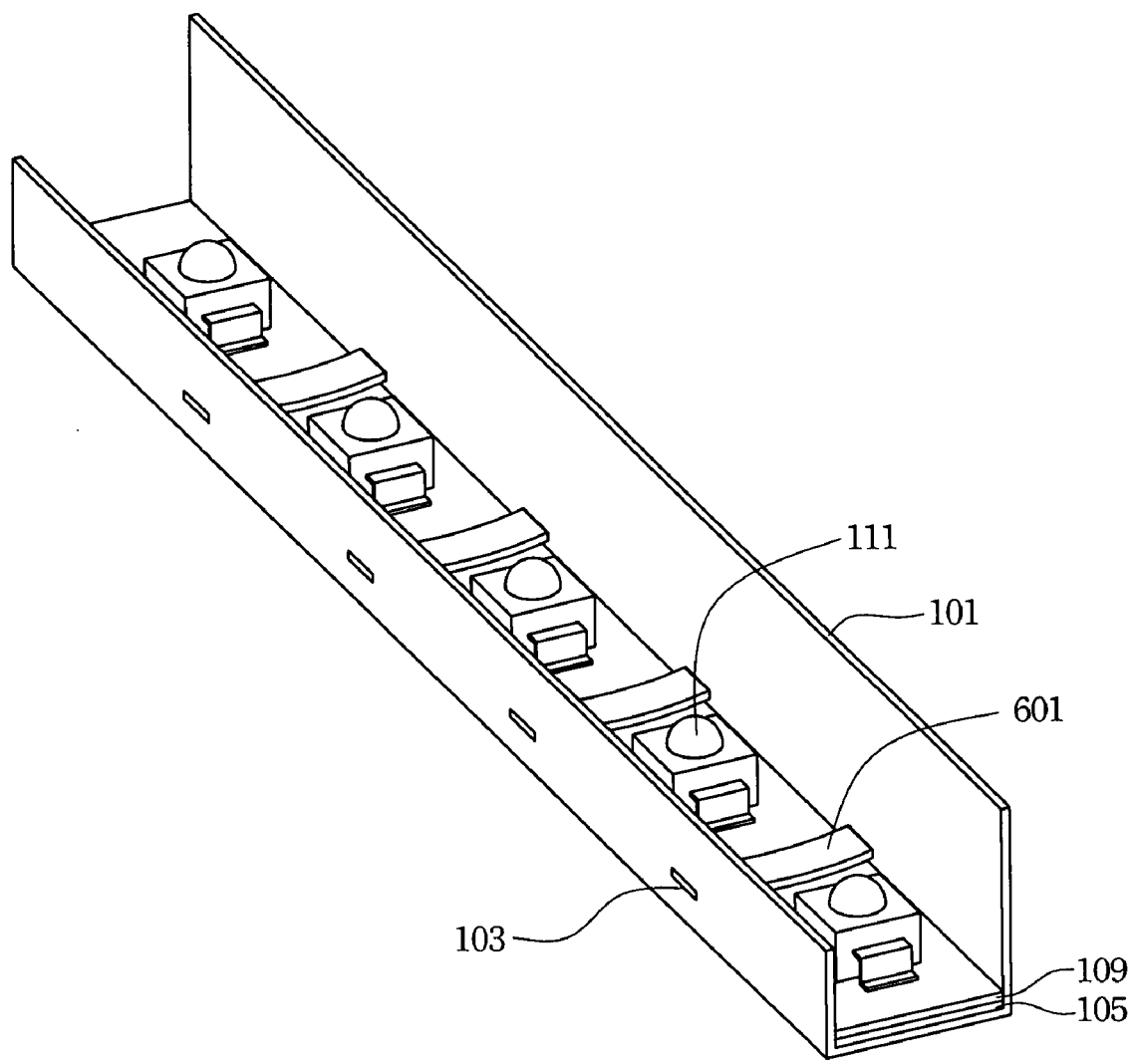
FIG. 7 shows the assembled light emitting diode device according to another embodiment of the present invention.
Figure 8:
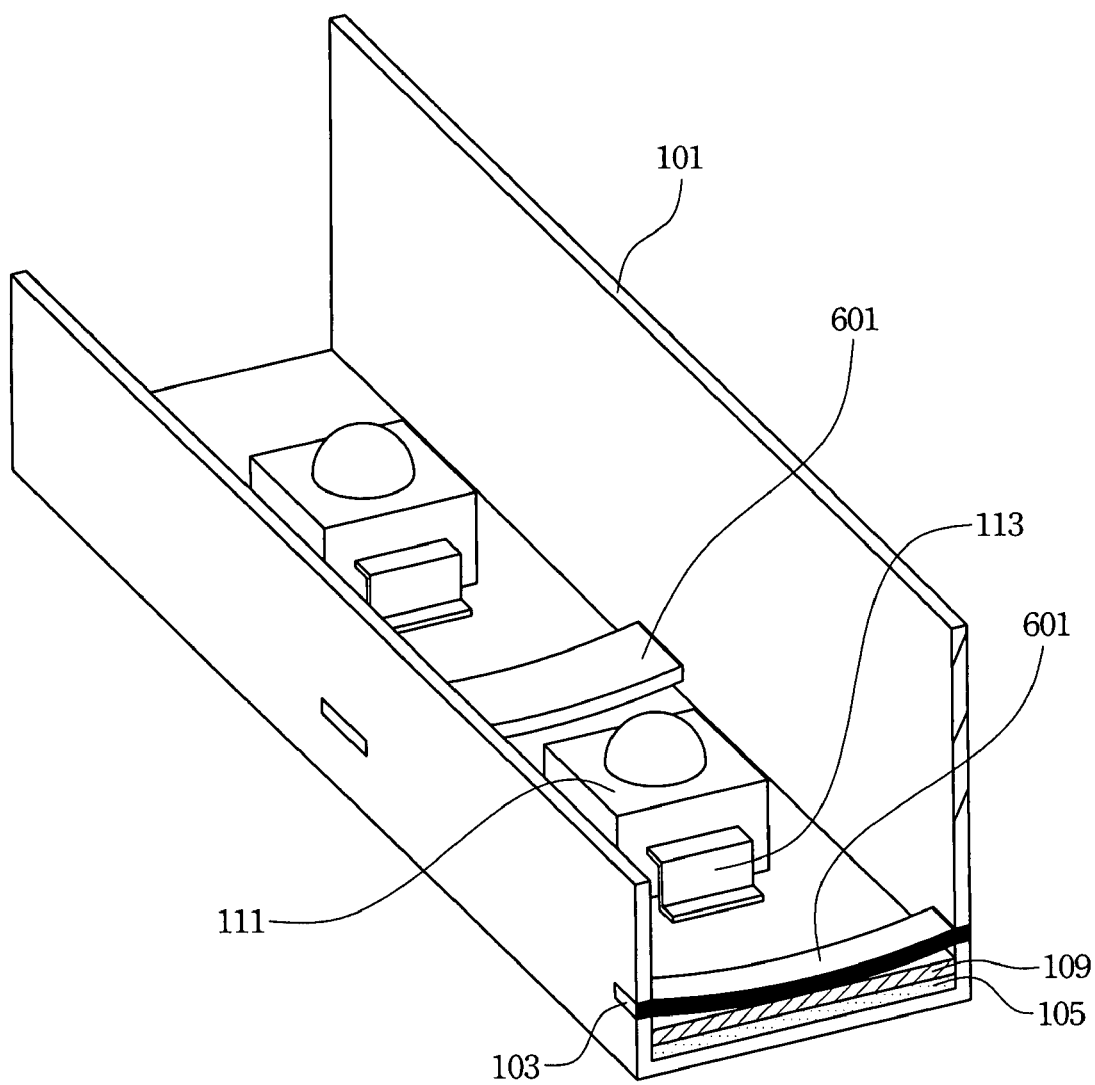
FIG. 8 shows the three dimensional diagram of the assembled light emitting diode device according to another embodiment of the present invention.

Please refer to both the FIG. 7 and FIG. 8. FIG. 7 shows the assembled light emitting diode device according to another embodiment of the present invention. FIG. 8 shows the three-dimensional diagram of the assembled light emitting diode device according to another embodiment of the present invention. In this light emitting diode device, the thermal energy generated by the light emitting diode 111 is delivered to the metal support 101 through the holder 113, the circuit board 109, the thermal conductive material 105. By pressing the circuit board 109 with the elastic element 601, the circuit board 109, the thermal conductive material 105, and the metal support 101 are compactly in contact, such that the thermal energy can be dissipated more efficiently.

According to the above embodiments, the light emitting diode back light module lodges the flanges of the circuit board or the elastic elements into the holes of the metal support, which compacts the circuit board, the thermal conductive material and the metal support. Therefore, the thermal energy generated by the light emitting diodes can be delivered to the metal support more efficiently, so that the thermal energy can be dissipated more effectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode back light module, comprising:
a metal support, having a recess and a plurality of holes formed on sidewalls of the metal support;
a thermal conductive adhesion material, having a bottom surface in contact with a bottom portion of the recess;
a circuit board, disposed on a top surface of the thermal conductive adhesion material, the circuit board fastened on the bottom portion of the recess of the metal support through the thermal conductive adhesion material, the circuit board having two long sides, two short sides, and a respective plurality of flanges on each of the two long sides, the flanges inserted into the holes of the metal support to compact the circuit board, the thermal conductive adhesion material and the metal support; and
a plurality of light emitting diodes disposed on the circuit board, wherein heat generated by the light emitting diodes is delivered to the metal support through the thermal conductive adhesion material.

2. The back light module as claimed in claim 1, further comprising:
a liquid crystal display panel; and
a light guide device, guiding the light generated by the light emitting diodes to the liquid crystal display panel.

3. The back light module as claimed in claim 1, wherein the recess of the metal support comprises two opposite sidewalls in contact with the bottom, and the holes are disposed on the sidewalls.

4. The back light module as claimed in claim 3, wherein the sidewalls have equal heights.

5. The back light module as claimed in claim 3, wherein the sidewalls have different heights.

6. The back light module as claimed in claim 1, wherein the circuit board is a printed circuit board, a metal substrate or a ceramic substrate.

7. The back light module as claimed in claim 1, wherein the thermal conductive adhesion material is a solid or a liquid.

8. The back light module as claimed in claim 1, wherein the thermal conductive adhesion material is metal, nonmetal, or a combination thereof.

9. The back light module as claimed in claim 1, wherein the light emitting diodes are arranged in a direction perpendicular to a direction defined by the flanges extending from the circuit board.

10. A light emitting diode back light module, comprising:
a metal support, having a recess and a plurality of holes formed on sidewalls of the metal support;

a thermal conductive adhesion material, having a bottom surface in contact with a bottom portion of the recess;

a circuit board, having two long sides and a bottom surface in contact with a top surface of the thermal conductive adhesion material;

a light emitting diode array, comprising a plurality of light emitting diodes disposed on a top surface of the circuit board; and at least one elastic fasten element, disposed between two of the light emitting diodes, the elastic fasten element having two ends inserted into respective holes of the metal support, wherein a main part of the elastic fasten element presses the circuit board for compacting the circuit board, the thermal conductive adhesion material and the metal support.

11. The back light module as claimed in claim 10, further comprising:

a liquid crystal display panel; and a light guide device, guiding the light generated by the light emitting diode array to the liquid crystal display panel.

12. The back light module as claimed in claim 10, wherein thermal energy generated by the light emitting diode array is delivered to the metal support through the circuit board and the thermal conductive adhesion material.

13. The back light module as claimed in claim 10, wherein the recess of the metal support comprises two sidewalls in contact with the bottom of the recess, wherein the holes are disposed on the sidewalls.

14. The back light module as claimed in claim 13, wherein the heights of the sidewalls are equal.

15. The back light module as claimed in claim 13, wherein the heights of the sidewalls are different.

16. The back light module as claimed in claim 10, wherein the elastic element is made of metal or plastic.

17. The back light module as claimed in claim 10, wherein the circuit board is a printed circuit board, a metal substrate or a ceramic substrate.

18. The back light module as claimed in claim 10, wherein the thermal conductive adhesion material is a solid or a liquid.

19. The back light module as claimed in claim 10, wherein the thermal conductive adhesion material is a soft tape.

20. The back light module as claimed in claim 10, wherein the light emitting diodes are arranged in a direction perpendicular to a direction defined by the two ends of the elastic fasten element.

* * * * *